(12) United States Patent
Li et al.

(10) Patent No.: US 10,958,261 B2
(45) Date of Patent: Mar. 23, 2021

(54) SERIAL PWM SIGNAL DECODING CIRCUIT AND METHOD BASED ON A CAPACITOR CHARGE-DISCHARGE STRUCTURE AND METHOD THEREOF

(71) Applicant: INSTITUTE OF MICROELECTRONICS, CHINESE ACADEMY OF SCIENCES, Beijing (CN)

(72) Inventors: Zhi Li, Beijing (CN); Jianzhong Zhao, Beijing (CN); Yumei Zhou, Beijing (CN); Weihua Xin, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 1 day.

(21) Appl. No.: 16/495,485

(22) PCT Filed: Mar. 20, 2017

(86) PCT No.: PCT/CN2017/077313
§ 371 (c)(1),
(2) Date: Sep. 19, 2019

(87) PCT Pub. No.: WO2018/170681
PCT Pub. Date: Sep. 27, 2018

(65) Prior Publication Data
US 2020/0099373 A1    Mar. 26, 2020

(51) Int. Cl.
*H03K 9/08* (2006.01)
*H02M 1/096* (2006.01)

(52) U.S. Cl.
CPC .............. *H03K 9/08* (2013.01); *H02M 1/096* (2013.01)

(58) Field of Classification Search
CPC .................................. H03K 9/08; H02M 1/096
See application file for complete search history.

(56) References Cited

U.S. PATENT DOCUMENTS 5,929,671 A * 7/1999 Best ................ H03K 17/04113
                                              327/131
2010/0164638 A1 * 7/2010 Saw .................... H03K 3/0231
                                              331/111

(Continued)

FOREIGN PATENT DOCUMENTS

CN        20313386 U      8/2013
CN       104283569 A      1/2015
(Continued)

OTHER PUBLICATIONS

International Search Report dated Nov. 30, 2017 issued in PCT/CN2017/077313.

Primary Examiner — Jeffrey M Shin
(74) Attorney, Agent, or Firm — Scully, Scott, Murphy & Presser, P.C.

(57) ABSTRACT

The present disclosure provides a serial PWM signal decoding circuit based on a capacitor charge-discharge structure, comprising: a timing logic generation circuit configured to receive, at an input end of the timing logic generation circuit, a PWM differential signal, and generate a timing logic signal; and at least two capacitor charge-discharge decoding modules, each of the at least two capacitor charge-discharge decoding modules has an input end connected to an output end of the timing logic generation circuit, and is configured to perform charging and discharging based on the timing logic signal. During a decoding process, a voltage at a charge-discharge capacitor of the capacitor charge-discharge decoding module before the charging and discharging is a common mode voltage VCM, and a voltage at a charge-discharge node after the end of the charging and discharging (Continued)

is a voltage $V_C$, and the PWM signal is decoded by identify the PWM signal through determining a polarity of a voltage difference between the common mode voltage VCM and the voltage $V_C$. The present disclosure further provides a method of decoding based on a capacitor charge-discharge structure. The present disclosure provides a simple structure and does not need synchronize code streams, thus avoiding the use of a complicated CDR and an oversampling structure, realizing the decoding of PWM signals at different rates, increasing the efficiency of signal transmission and lowering the power consumption.

18 Claims, 4 Drawing Sheets

(56) References Cited

U.S. PATENT DOCUMENTS

2011/0080191 A1* 4/2011 Patel ................. H03F 3/217
327/105
2014/0292402 A1 10/2014 Nandy et al.

FOREIGN PATENT DOCUMENTS

| CN | 106951385 A | 7/2017 |
| WO | WO 2013/110015 A1 | 7/2013 |

* cited by examiner

SERIAL PWM SIGNAL DECODING CIRCUIT AND METHOD BASED ON A CAPACITOR CHARGE-DISCHARGE STRUCTURE AND METHOD THEREOF

TECHNICAL FIELD

The present disclosure relates to the field of integrated circuit design related to an M-PHY interface, and in particular to a serial PWM signal decoding circuit based on a capacitor charge-discharge structure and a method thereof.

BACKGROUND

In the field of serial interface, PWM signal is commonly used for data transmission in low-rate mode, such as mipi M_PHY. Such signal is characterized in that one UI with ⅓ being occupied by low level and ⅔ being occupied by high level represents data 1, and one UI with ⅔ being occupied by low level and ⅓ being occupied by high level represents data 0. The PWM signal has a transmission data rate varying from several MHz to several hundred of MHz to meet the requirement of power saving under different data traffic, while there is no transmission of synchronization codes in low-rate mode.

At present, the existing schemes achieve decoding of serial PWM signal using oversampling or based on CDR structure. However these approaches have problems such as complicated circuit structure, waste of redundant power, cannot cover large range of data rate variation, and even requirement of synchronization code to achieve decoding. Accordingly, there is a need for a PWM signal receiving circuit which has simple structure and low power consumption, is applicable to different operating rates and is capable of receiving without synchronization data codes.

SUMMARY

1. Technical Problem to be Solved

In view of the above problems, the present disclosure provides a serial PWM signal decoding circuit based on a capacitor charge-discharge structure and a method thereof. The structure according to the present disclosure is simple and avoids the use of a complicated CDR or oversampling structure. Additionally, a capacitance-programmable charge-discharge capacitor and a current-programmable current source are used to achieve PWM signal decoding at different rates, and the decoding of serial PWM signal can be achieved without synchronization code, thereby increasing the efficiency of signal transmission and lowering the power consumption.

2. Technical Solution

According to an aspect of the present disclosure, there is proposed a serial PWM signal decoding circuit based on a capacitor charge-discharge structure, wherein the circuit comprising: a timing logic generation circuit configured to receive, at an input end of the timing logic generation circuit, a PWM differential signal, and generate a timing logic signal based on the inputted PWM differential signal; and at least two capacitor charge-discharge decoding modules, each of the at least two capacitor charge-discharge decoding modules has an input end connected to an output end of the timing logic generation circuit, and is configured to receive the timing logical signal transmitted by the timing logic generation circuit and perform charging and discharging based on the timing logic signal; wherein, during decoding, a voltage at a charge-discharge capacitor of the capacitor charge-discharge decoding module before the charging and discharging is a common mode voltage VCM, and a voltage at a charge-discharge node after the end of the charging and discharging is a voltage $V_C$, and the PWM signal is decoded by identify the PWM signal through determining a polarity of a voltage difference between the common mode voltage VCM and the voltage $V_C$.

Preferably, the timing logic generation circuit comprises: an input port PWM_P, PWM_N configured to receive the inputted low voltage differential PWM signal; at least two groups of timing logic output ports respectively connected to input ports of the at least two capacitor charge-discharge decoding modules, wherein, a first group of the timing logic output ports is configured to output signals SWP1, SWN1, SWR1 and SA1, respectively for controlling a charging switch SWP, a discharging switch SWN, a reset switch SWR and an SA port of a first capacitor charge-discharge decoding module; a second group of the timing logic output ports is configured to output signals SWP2, SWN2, SWR2 and SA2, respectively for controlling a charging switch SWP, a discharging switch SWN, a reset switch SWR and an SA port of a second capacitor charge-discharge decoding module.

Preferably, the capacitor charge-discharge decoding module comprises: a charge-discharge capacitor $C_0$ having a charge-discharge node C connected with a common mode voltage input end VCM through the switch SWR; a current source $I_{ch}$ connected in series with the switch SWP for charging the charge-discharge capacitor $C_0$; a current source $I_{dis}$ connected in series with the switch SWN for discharging the charge-discharge capacitor $C_0$; and a comparator having a positive input end connected with the charge-discharge node C of the charge-discharge capacitor $C_0$, and a negative input end connected with the common mode voltage input end VCM, the comparator is configured to determine the polarity of the voltage difference between the voltage $V_C$ and the common mode voltage VCM; and a register having a data input port D connected with an input end of the comparator, a data output port Q connected with a data output end DATA of the capacitor charge-discharge decoding module, and a clock port clk connected with the port SA of the capacitor charge-discharge decoding module, the register is configured to store a result of decoding.

Preferably, when a low level of the PWM signal arrives, the SWR is turned off and the SWP is turned on, and the current source $I_{ch}$ charges the charge-discharge capacitor $C_0$; and when a high level of the PWM signal arrives, the SWP is turned off and the SWN is turned on, and the current source $I_{dis}$ discharges the charge-discharge capacitor $C_0$.

Preferably, each of the current source $I_{ch}$ and the current source $I_{dis}$ is a programmable current source configured to provide a current varying with a data rate of the PWM signal, wherein the larger the data rate is, the larger the current is; and the smaller the data rate is, the smaller the current is.

Preferably, the charge-discharge capacitor $C_0$ is a programmable charge-discharge capacitor, and a capacitance value of the charge-discharge capacitor $C_0$ varies with the data rate of the PWM signal, wherein the larger the data rate is, the smaller the capacitance value is; and the smaller the data rate is, the larger the capacitance value is.

Preferably, the serial PWM signal decoding circuit comprises two capacitor charge-discharge decoding modules configured to alternately operate under control of the timing logic generation circuit to achieve continuous decoding of the serial PWM signal.

Preferably, the two capacitor charge-discharge decoding modules are respectively a first capacitor charge-discharge decoding module and a second capacitor charge-discharge decoding module; wherein, the first capacitor charge-discharge decoding module is configured to perform charging and discharging at an odd bit of the serial PWM signal, and complete registering and outputting of data and resetting of the module at an even bit of the serial PWM signal; the second capacitor charge-discharge decoding module is configured to perform charging and discharging at an even bit of the serial PWM signal, and complete registering and outputting of data and resetting of the module at an odd bit of the serial PWM signal; thereby the two modules are configured to alternately operate to achieve continuous decoding of the serial PWM signal.

Preferably, the voltage difference between the common mode voltage VCM and the voltage VC of the charge-discharge node of the charge-discharge capacitor keeps consistent at different data rates, that is, the following equation is satisfied:

$$\frac{UI \times I_0}{C_0} = const$$

where UI represents a time length of 1 bit data, I0 represents a charge-discharge current, C0 represents a capacitance of the charge-discharge capacitor, and const represents a constant.

According to another aspect of the present disclosure, there is also proposed a method of decoding by a serial PWM signal decoding circuit based on a capacitor charge-discharge structure, comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

3. Beneficial Effects

It can be seen from the above technical solutions that the serial PWM signal decoding circuit based on a capacitor charge-discharge structure and the method thereof according to the present disclosure have the following beneficial effects:

1) In the present disclosure, with the timing logic generation circuit and the capacitor charge-discharge decoding module, the serial PWM signal can be decoded without synchronization code. The present disclosure proposes a simple structure and avoids the use of complicated CDR and oversampling structure, thereby increasing the efficiency of signal transmission and lowering the power consumption;

2) In the present disclosure, with a capacitance-programmable charge-discharge capacitor and a current-programmable current source in the charge-discharge decoding module, decoding of the PWM signal may be achieved at different rates.

BRIEF DESCRIPTION OF THE ACCOMPANYING DRAWINGS

DETAILED DESCRIPTION

Figure 1:
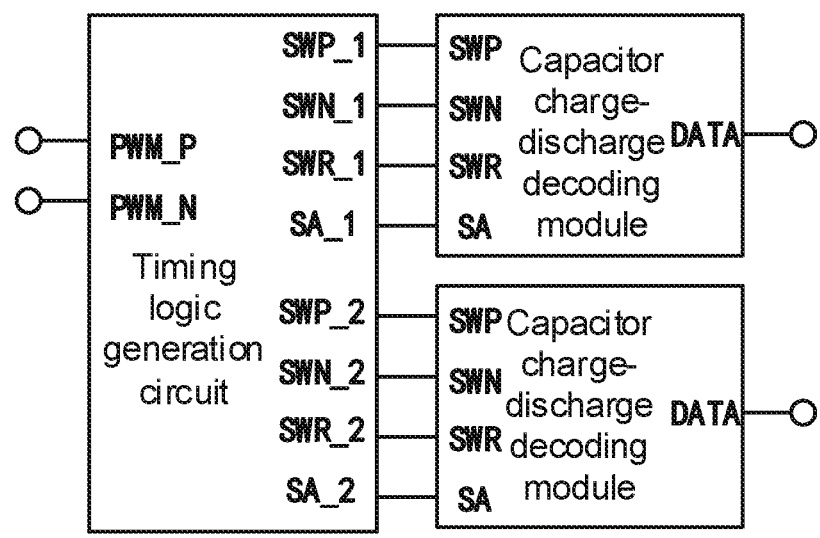
FIG. 1 illustrates a structural diagram of a serial PWM signal decoding circuit based on a capacitor charge-discharge structure according to an embodiment of the present disclosure.

In order to make the purpose, technical solution and advantages of the present disclosure more apparent, the present disclosure will be further described in detail below in connection with specific embodiments and with reference to the accompanying drawings.

It should be noted that in the drawings or the description, the same reference numerals are used for similar or identical parts. Moreover, in the drawings, the shape or thickness of an embodiment may be expanded and simplified or conveniently indicated. Furthermore, elements or implementations not shown or described in the drawings are in the form known to those ordinary skilled in the art. Additionally, although an example of a parameter containing a particular value may be provided in the present disclosure, it should be understood that the parameter does not need to be exactly equal to the corresponding value, but rather may approximate the corresponding value within an acceptable tolerance or design constraint.

Preferred embodiment of the present invention will be given below. It should be noted that the preferred embodiment is only for understanding the present disclosure and not intended to limit the scope of the present disclosure. Moreover, the features in the preferred embodiment are applicable to both the method embodiment and the device embodiment, unless otherwise specified. The technical features present in the same or different embodiments may be used in combination in case of not conflicting with each other.

FIG. 1 illustrates a structural diagram of a serial PWM signal decoding circuit based on a capacitor charge-discharge structure according to an embodiment of the present disclosure. Referring to FIG. 1, the serial PWM signal decoding circuit based on a capacitor charge-discharge structure according to the embodiment comprises:

a timing logic generation circuit configured to receive, at an input end of the timing logic generation circuit, a PWM differential signal, and generate a timing logic signal based on the inputted PWM differential signal; and at least two capacitor charge-discharge decoding modules, each of the at least two capacitor charge-discharge decoding modules has an input end connected to an output end of the timing logic generation circuit, and is configured to receive the timing logical signal transmitted by the timing logic generation circuit and perform charging and discharging based on the timing logic signal; wherein, during decoding, a voltage at a charge-discharge capacitor of the capacitor charge-discharge decoding module before the charging and discharging is a common mode voltage VCM, and a voltage at a charge-discharge node after the end of the charging and discharging is a voltage $V_C$, and the PWM signal is decoded by identify the PWM signal through determining a polarity of a voltage difference between the common mode voltage VCM and the voltage $V_C$.

Particularly, the serial PWM signal decoding circuit based on a capacitor charge-discharge structure may comprise two capacitor charge-discharge decoding modules that alternately operate under the control of the timing logic generation circuit to achieve continuous decoding of the serial PWM signal.

More particularly, the two capacitor charge-discharge decoding modules are respectively a first capacitor charge-discharge decoding module and a second capacitor charge-discharge decoding module. The first charge-discharge decoding module may perform charging and discharging at an odd bit of the serial PWM signal and complete registering and outputting of data and resetting of the module at an even bit of the serial PWM signal. The second charge-discharge decoding module may perform charging and discharging at an even bit of the serial PWM signal, and complete registering and outputting of data and resetting of the module at an odd bit of the serial PWM signal. Thus the two modules operate alternately to achieve continuous decoding of serial PWM signal. Of course, the operating order of the two capacitor charge-discharge decoding modules may also be reversed as long as they operate alternately.

In addition, the serial PWM signal decoding circuit based on the capacitor charge-discharge structure may also comprise three or more capacitor charge-discharging decoding modules. The three or more capacitor charge-discharge decoding modules sequentially operate in turn under control of the timing logic generation circuit, thereby achieving the continuous decoding of the serial PWM signal. Taking three capacitor charge-discharge decoding modules as an example, the three capacitor charge-discharge decoding modules are respectively a first capacitor charge-discharge decoding module, a second capacitor charge-discharge decoding module, and a third capacitor charge-discharge decoding module. The first capacitor charge-discharge decoding module may perform charging and discharging at a first bit of the serial PWM signal and complete registering and outputting of data and resetting of the module during the charging and discharging of the second and third capacitor charge-discharge decoding modules; the second capacitor charge-discharge decoding module may perform charging and discharging at a second bit of the serial PWM signal and complete registering and outputting of data and resetting of the module during the charging and discharging of the third and first capacitor charge-discharge decoding modules; and the third capacitor charge-discharge decoding module may perform charging and discharging at a third bit of the serial PWM signal and complete registering and outputting of data and resetting of the module during the charging and discharging of the first and second capacitor charge-discharge decoding modules. Thereby the three modules operate alternately to achieve continuous decoding of the serial PWM signal. Of course, the operating order of the capacitor charge-discharge decoding modules may also be reversed, as long as in any bit period, at least one of the capacitor charge-discharge decoding module performs charging and discharging and the others of the capacitor charge-discharge decoding modules perform data register output and module reset.

With continued reference to FIG. 1, the timing logic generation circuit comprises:

an input port PWM_P, PWM_N configured to receive the inputted low voltage differential PWM signal;

at least two groups of timing logic output ports respectively connected to input ports of the at least two capacitor charge-discharge decoding modules, wherein a first group of the timing logic output ports is configured to output signals SWP1, SWN1, SWR1, and SA1. SWP1 is used to control the charging switch SWP of the first capacitor charge-discharge decoding module, and SWN1 is used to control the discharging switch SWN of the first capacitor charge-discharge decoding module, SWR1 is used to control the reset switch SWR of the first capacitor charge-discharge decoding module, and SA1 is connected with an SA port of the first capacitor charge-discharge decoding module.

Correspondingly, a second group of the timing logic output ports is configured to output signals SWP2, SWN2, SWR2, and SA2. SWP2 is used to control the charging switch SWP of the second capacitor charge-discharge decoding module, SWN2 is used to control the discharging switch SWN of the second capacitor charge-discharge decoding module, SWR2 is used to control the reset switch SWR of the second capacitor charge-discharge decoding module, and SA2 is connected with an SA port of the second capacitor charge-discharge decoding module.

Figure 2:
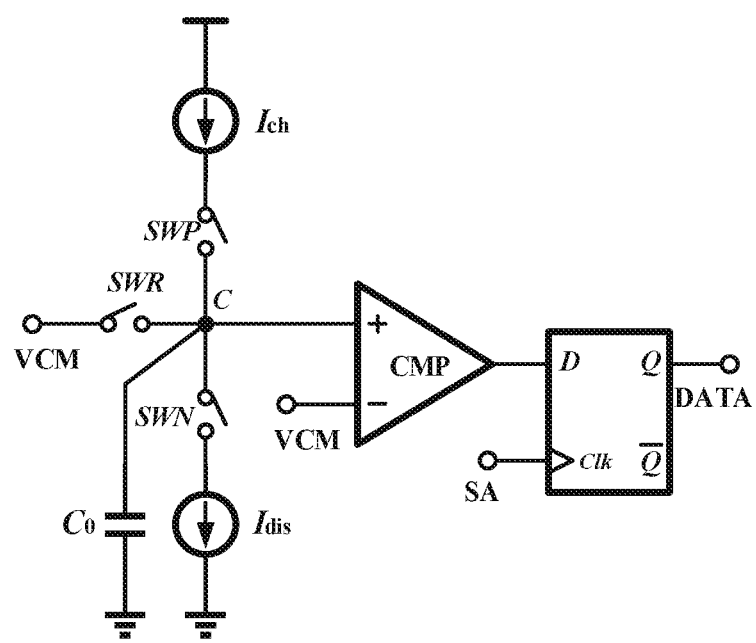
FIG. 2 illustrates a circuit diagram of a capacitor charge-discharge decoding module according to an embodiment of the present disclosure.

FIG. 2 illustrates a diagram of a capacitor charge-discharge decoding module according to an embodiment of the present disclosure. Referring to FIG. 2, the capacitor charge-discharge decoding module according to the embodiment comprises:

a charge-discharge capacitor $C_0$ having a charge-discharge node C connected with a common mode voltage input end VCM through the switch SWR;

a current source $I_{ch}$ connected in series with the switch SWP for charging the charge-discharge capacitor $C_0$;

a current source $I_{dis}$ connected in series with the switch SWN for discharging the charge-discharge capacitor $C_0$;

a comparator having a positive input end connected with the charge-discharge node C of the charge-discharge capacitor $C_0$, and a negative input end connected with the common mode voltage input end VCM; and a register having a data input port D connected with an input end of the comparator, a data output port Q connected with a data output end DATA of the capacitor charge-discharge decoding module, and a clock port clk connected with the port SA of the capacitor charge-discharge decoding module.

Particularly, when the low level of the PWM signal arrives, the SWR is turned off and the SWP is turned on, so that the current source $I_{ch}$ charges the charge-discharge capacitor $C_0$; and when the high level arrives, the SWP is turned off and the SWN is turned on, so that the current source $I_{dis}$ discharges the charge-discharge capacitor $C_0$.

The capacitor charge-discharge decoding module determines the polarity of the voltage difference $_\Delta V$ between the voltage $V_C$ and the common mode voltage VCM by the comparator to identify and thus decode the PWM signal, and stores a result of decoding by the register.

Preferably, each of the current source $I_{ch}$ and the current source $I_{dis}$ may be a programmable current source. The current provided by each of the programmable current source $I_{ch}$ and the programmable current source $I_{dis}$ varies with a data rate of the PWM signal, wherein the larger the data rate is, the larger the current is; and the smaller the data rate is, the smaller the current is. The charge-discharge capacitor $C_0$ may be a programmable charge-discharge capacitor. Here, a capacitance value of the charge-discharge capacitor $C_0$ varies with the data rate of the PWM signal, wherein the larger the data rate is, the smaller the capacitance value is; and the smaller the data rate is, the larger the capacitance value is.

Figure 3:
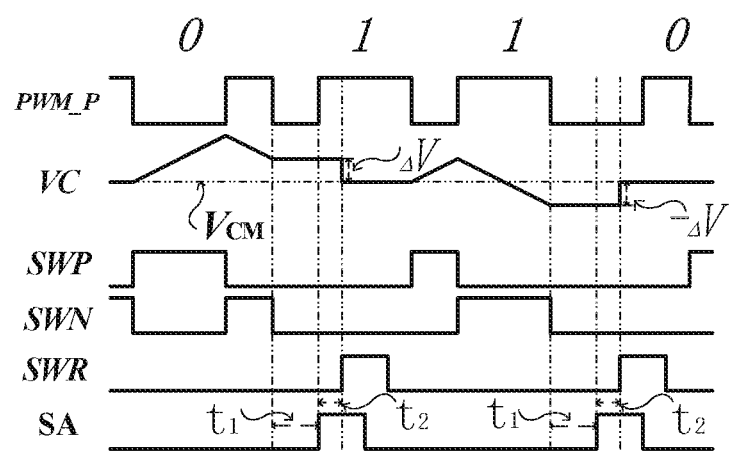
FIG. 3 illustrates an operation timing diagram of the capacitor charge-discharge decoding module according to an embodiment of the present disclosure.

The operating process of a capacitor charge-discharge decoding module according to an embodiment of the present disclosure will be described in detail below. FIG. 3 illustrates an operation timing diagram of the capacitor charge-discharge decoding module according to the embodiment of the present disclosure.

Referring to FIG. 3, before the PWM signal arrives, the initial voltage of the charge-discharge capacitor is the common mode voltage VCM. When a low level of a first bit of the PWM signal arrives, the SWN is turned off and the SWP is turned on. If the PWM signal is 0, i.e., with low level occupying ⅔ UI (UI is a time duration of 1 bit data) and high level occupying ⅓ UI, the charge-discharge capacitor $C_0$ is charged for a time period of ⅔ UI with a charging current $I_0$. When the high level arrives, the SWP is turned off and the SWN is turned on, so that the charge-discharge capacitor $C_0$ is discharged for a time period of ⅓ UI with a discharging current $I_0$. The SWN is turned off, and at this time, there is a positive voltage difference $_\Delta V$ between the voltage $V_C$ of the charge-discharge node C of the charge-discharge capacitor $C_0$ and the common mode voltage VCM:

$$_\Delta V = \frac{\frac{1}{3} UI \times I_0}{C_0}$$

If the PWM signal is 1, i.e., with low level occupying ⅓ UI and high level occupying ⅔ UI, the charge-discharge capacitor $C_0$ is charged for a time period of ⅓ UI and discharged for a time period of ⅔ UI, and the charging and discharging current is $I_0$. The SWN is turned off, and at this time, there is a negative voltage difference $-_\Delta V$ between the voltage $V_C$ of the charge-discharge node C of the charge-discharge capacitor $C_0$ and the common mode voltage VCM:

$$-_\Delta V = \frac{\frac{1}{3} UI \times I_0}{C_0}$$

After the end of the first bit PWM signal, the voltage of the charge-discharge node C needs to be maintained for a time period $t_1$ to ensure the comparator to correctly recognize $_\Delta V$ or $-_\Delta V$ and output a rail-to-rail comparison result. The SA signal undergoes a rising edge jump when the time period $t_1$ is elapsed after the end of the first bit PWM signal. With the triggering of the rising edge, the register stores the comparison result from the comparator and outputs it to DATA to complete the decoding of the first bit of the PWM signal.

The SA needs to become low before the end of a second bit of the PWM signal. The SWR is delayed by $t_2$ with respect to the rising edge of the SA to ensure that the register is turned on for a period of time after it completes the registering and outputting of data. The voltage of the charge-discharge capacitor is reset to VCM. The SWR needs to be turned off before the end of the second bit PWM signal. The capacitor charge-discharge decoding module completes the charging and discharging during the first bit of the PWM signal, and completes the registering and outputting of data and the resetting of the module during the second bit of the PWM signal.

When the input PWM data rate changes, that is, the value of the UI changes, $_\Delta V$ or $-_\Delta V$ should keep consistent at different data rates in order to ensure that the decoding effect is not affected by the data rate. In other words:

$$\frac{UI \times I_0}{C_0} = const$$

where const represents a constant. When the data rate is increased and UI is decreased, the normal operation of the capacitor charge-discharge decoding module may be ensured by increasing $I_0$ or decreasing $C_0$. When the data rate is decreased and the UI is increased, the normal operation of the capacitor charge-discharge decoding module may be ensured by decreasing $I_0$ or increasing $C_0$.

Figure 4:
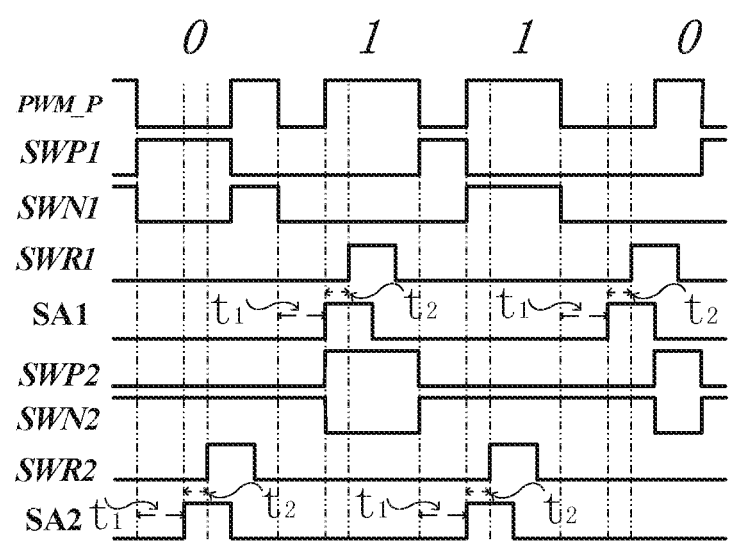
FIG. 4 illustrates a timing diagram of the timing logic signals outputted by a timing logic generation circuit according to an embodiment of the present disclosure.

The following takes the case of two capacitor charge-discharge decoding modules as an example to describe details of the process of outputting a timing logic signal by the timing logic generation circuit according to an embodiment of the present disclosure. FIG. 4 illustrates a diagram where the timing logic generation circuit outputs a timing logic signal. Before the PWM signal arrives, an initial voltage value of the charge-discharge capacitor of the first capacitor charge-discharge decoding module is the common mode voltage VCM. When a low level of the first bit of the PWM signal arrives, the SWR1 is turned off and the SWP1 is turned on, so that the charge-discharge capacitor of the first capacitor charge-discharge decoding module is charged during the low level. When a high level arrives, the SWP1 is turned off and the SWN1 is turned on, then the charge-discharge capacitor of the first capacitor charge-discharge decoding module is discharged during the high level. After the end of the high level, the SWN1 is turned off and the charging and discharging process is completed. A time period is elapsed to ensure that the comparator outputs a correct comparison result. The SA1 signal undergoes a rising edge jump after the time period $t_1$ is elapsed after the end of the first bit of the PWM signal. With the triggering of the rising edge, the register stores the comparison result from the comparator and outputs it to DATA to complete the decoding of the first bit of the PWM signal.

The SA1 needs to become low before the end of a second bit of the PWM signal. The SWR1 is delayed by $t_2$ with respect to the rising edge of the SA1 to ensure that the register is turned on for a time period after it completes registering and outputting of data. The voltage of the charge-discharge capacitor is reset to VCM. The SWR1 needs to be turned off before the end of the second bit of the PWM signal. The first capacitor charge-discharge decoding module completes the charging and discharging during the first bit of the PWM signal, and completes registering and outputting of data and resetting of the module during the second bit of the PWM signal.

During the first bit of the PWM signal, the second capacitor charge-discharge decoding module completes initialization. When a low level of the second bit of the PWM signal arrives, the SWR2 is turned off and the SWP2 is turned on, so that the charge-discharge capacitor of the second capacitor charge-discharge decoding module is charged during the low level. When a high level arrives, the SWP2 is turned off and the SWN2 is turned on, so that the charge-discharge capacitor of the first capacitor charge-discharge decoding module is discharged during the high level. After the end of the high level, the SWN2 is turned off and the charging and discharging process is completed. A time period $t_1$ is elapsed to ensure that the comparator outputs a correct comparison result. The SA2 signal undergoes a rising edge jump when the time period $t_1$ is elapsed after the end of the first bit of the PWM signal. With the triggering of the rising edge, the register stores the comparison result from the comparator and outputs it to DATA to complete the decoding of the first bit of the PWM signal.

The SA2 needs to become low before the end of the second bit of the PWM signal. The SWR2 is delayed by $t_2$ with respect to the rising edge of the SA2 to ensure that the register is turned on for a time period after it completes registering and outputting of data. The voltage of the charge-discharge capacitor is reset to VCM. The SWR2 needs to be turned off before the end of a third bit the PWM signal. The second capacitor charge-discharge decoding module completes the charging and discharging during the second bit of the PWM signal, and completes registering and outputting of data and resetting of the module during the third bit of the PWM signal.

Under the control of the timing logic generation circuit, the two capacitor charge-discharge decoding modules alternately operate. The first capacitor charge-discharge decoding module performs charging and discharging at an odd bit of the serial PWM signal and completes registering and outputting of data and resetting of the module at an even bit of the serial PWM signal. The second capacitor charge-discharge decoding module performs charging and discharging at an even bit of the serial PWM signal and completes registering and outputting of data and resetting of the module at an odd bit of the serial PWM signal. The two modules alternately operate to achieve the continuous decoding of the serial PWM signal.

In addition, there is further proposed a serial PWM signal decoding method according to an embodiment of the present disclosure. The method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

In the embodiment of the present disclosure, any timing logic generation circuit capable of driving the at least two capacitor charge-discharge decoding modules to complete the decoding operation may be used for the serial PWM signal decoding circuit based on a capacitor charge-discharge structure according to the present disclosure. The timing logic generation circuit particularly implemented in any manner is within the scope of the claims of the present disclosure.

In summary, the serial PWM signal decoding circuit based on a capacitor charge-discharge structure and method thereof according to the embodiments of the present disclosure has a simple structure and avoids the use of complicated CDR and oversampling structure. With a capacitance-programmable charge-discharge capacitor and a current-programmable current source, PWM signal decoding may be achieved at different rates. At the same time, the PWM signal decoding circuit can completely decode all of the received PWM signals without synchronization code stream, thereby increasing the efficiency of signal transmission and lowering the power consumption.

It should be noted that the above definitions of the various elements are not limited to the specific structures or shapes mentioned in the embodiments, and those ordinary skilled in the art can simply and well replace them, for example:

The charge-discharge decoding module can also perform discharging during a low level of the PWM signal and perform charging during a high level of the PWM signal, and the present disclosure can also be implemented.

Although the purpose, technical solution and beneficial effects of the present disclosure have been described with reference to the above specific embodiments, it is to be understood that the embodiments described above are not intended to limit the present disclosure. Accordingly, any modification, equivalent substitution, improvement, etc., within the spirit and scope of the present disclosure is intended to be included within the scope of the present disclosure.

We claim:

1. A serial PWM signal decoding circuit based on a capacitor charge-discharge structure, wherein the circuit comprising:

a timing logic generation circuit configured to receive, at an input end of the timing logic generation circuit, a PWM differential signal, and generate a timing logic signal based on the inputted PWM differential signal; and at least two capacitor charge-discharge decoding modules, each of the at least two capacitor charge-discharge decoding modules has an input end connected to an output end of the timing logic generation circuit, and is configured to receive the timing logical signal transmitted by the timing logic generation circuit and perform charging and discharging based on the timing logic signal; wherein, during decoding, a voltage at a charge-discharge capacitor of the capacitor charge-discharge decoding module before the charging and discharging is a common mode voltage VCM, and a voltage at a charge-discharge node after the end of the charging and discharging is a voltage $V_C$, and the PWM signal is decoded by identify the PWM signal through determining a polarity of a voltage difference between the common mode voltage VCM and the voltage $V_C$.

2. The serial PWM signal decoding circuit based on the capacitor charge-discharge structure according to claim 1, wherein the timing logic generation circuit comprises:

an input port PWM_P, PWM_N configured to receive the inputted low voltage differential PWM signal;

at least two groups of timing logic output ports respectively connected to input ports of the at least two capacitor charge-discharge decoding modules, wherein, a first group of the timing logic output ports is configured to output signals SWP1, SWN1, SWR1 and SA1, respectively for controlling a charging switch SWP, a discharging switch SWN, a reset switch SWR and an SA port of a first capacitor charge-discharge decoding module;

a second group of the timing logic output ports is configured to output signals SWP2, SWN2, SWR2 and SA2, respectively for controlling a charging switch SWP, a discharging switch SWN, a reset switch SWR and an SA port of a second capacitor charge-discharge decoding module.

3. The serial PWM signal decoding circuit based on the capacitor charge-discharge structure according to claim 2, wherein the capacitor charge-discharge decoding module comprises:
   a charge-discharge capacitor $C_0$ having a charge-discharge node C connected with a common mode voltage input end VCM through the switch SWR;
   a current source $I_{ch}$ connected in series with the switch SWP for charging the charge-discharge capacitor $C_0$;
   a current source $I_{dis}$ connected in series with the switch SWN for discharging the charge-discharge capacitor $C_0$;
   a comparator having a positive input end connected with the charge-discharge node C of the charge-discharge capacitor $C_0$, and a negative input end connected with the common mode voltage input end VCM, the comparator is configured to determine the polarity of the voltage difference between the voltage $V_C$ and the common mode voltage VCM; and
   a register having a data input port D connected with an input end of the comparator, a data output port Q connected with a data output end DATA of the capacitor charge-discharge decoding module, and a clock port clk connected with the port SA of the capacitor charge-discharge decoding module, the register is configured to store a result of decoding.

4. The serial PWM signal decoding circuit based on the capacitor charge-discharge structure according to claim 3, wherein,
   when a low level of the PWM signal arrives, the SWR is turned off and the SWP is turned on, so that the current source $I_{ch}$ charges the charge-discharge capacitor $C_0$; and
   when a high level of the PWM signal arrives, the SWP is turned off and the SWN is turned on, so that the current source $I_{dis}$ discharges the charge-discharge capacitor $C_0$.

5. The serial PWM signal decoding circuit based on the capacitor charge-discharge structure according to claim 3, wherein each of the current source $I_{ch}$ and the current source $I_{dis}$ is a programmable current source configured to provide a current varying with a data rate of the PWM signal, wherein the larger the data rate is, the larger the current is; and the smaller the data rate is, the smaller the current is.

6. The serial PWM signal decoding circuit based on the capacitor charge-discharge structure according to claim 3, wherein the charge-discharge capacitor $C_0$ is a programmable charge-discharge capacitor, and a capacitance value of the charge-discharge capacitor $C_0$ varies with the data rate of the PWM signal, wherein the larger the data rate is, the smaller the capacitance value is; and the smaller the data rate is, the larger the capacitance value is.

7. The serial PWM signal decoding circuit based on the capacitor charge-discharge structure according to claim 3, wherein the serial PWM signal decoding circuit comprises two capacitor charge-discharge decoding modules configured to alternately operate under control of the timing logic generation circuit to achieve continuous decoding of the serial PWM signal.

8. The serial PWM signal decoding circuit based on the capacitor charge-discharge structure according to claim 7, wherein the two capacitor charge-discharge decoding modules are respectively a first capacitor charge-discharge decoding module and a second capacitor charge-discharge decoding module; wherein,
   the first capacitor charge-discharge decoding module is configured to perform charging and discharging at an odd bit of the serial PWM signal, and complete registering and outputting of data and resetting of the module at an even bit of the serial PWM signal;
   the second capacitor charge-discharge decoding module is configured to perform charging and discharging at an even bit of the serial PWM signal, and complete registering and outputting of data and resetting of the module at an odd bit of the serial PWM signal; thereby the two modules are configured to alternately operate to achieve continuous decoding of the serial PWM signal.

9. The serial PWM signal decoding circuit based on the capacitor charge-discharge structure according to claim 3, wherein the voltage difference between the common mode voltage VCM and the voltage $V_C$ of the charge-discharge node of the charge-discharge capacitor keeps consistent at different data rates, that is, the following equation is satisfied:

$$\frac{UI \times I_0}{C_0} = const$$

where UI represents a time duration of 1 bit data, $I_0$ represents a charge-discharge current, $C_0$ represents a capacitance of the charge-discharge capacitor, and const represents a constant.

10. A method of decoding by the serial PWM signal decoding circuit based on the capacitor charge-discharge structure according to claim 1, wherein the method comprising:
   S1: resetting an initial voltage value of the charge-discharge capacitor $C_0$ of a capacitor charge-discharge decoding module to a common mode voltage VCM before the arrival of the PWM signal;
   S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and
   S3: determining a polarity of a voltage difference $_\Delta V$ between the voltage $V_C$ and the common mode voltage VCM to identify and thus decode the PWM signal.

11. A method of decoding by the serial PWM signal decoding circuit based on the capacitor charge-discharge structure according to claim 2, wherein the method comprising:
   S1: resetting an initial voltage value of the charge-discharge capacitor $C_0$ of a capacitor charge-discharge decoding module to a common mode voltage VCM before the arrival of the PWM signal;
   S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

12. A method of decoding by the serial PWM signal decoding circuit based on the capacitor charge-discharge structure according to claim 3, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

13. A method of decoding by the serial PWM signal decoding circuit based on the capacitor charge-discharge structure according to claim 4, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

14. A method of decoding by the serial PWM signal decoding circuit based on the capacitor charge-discharge structure according to claim 5, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

15. A method of decoding by the serial PWM signal decoding circuit based on the capacitor charge-discharge structure according to claim 6, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

16. A method of decoding by the serial PWM signal decoding circuit based on the capacitor charge-discharge structure according to claim 7, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

17. A method of decoding by the serial PWM signal decoding circuit based on the capacitor charge-discharge structure according to claim 8, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

18. A method of decoding by the serial PWM signal decoding circuit based on the capacitor charge-discharge structure according to claim 9, wherein the method comprising:

S1: resetting an initial voltage value of the charge-discharge capacitor $C_0$ of a capacitor charge-discharge decoding module to a common mode voltage VCM before the arrival of the PWM signal;

S2: when a bit of the PWM signal arrives, charging the charge-discharge capacitor $C_0$ during the bit of the PWM signal being at a low level, and discharging the charge-discharge capacitor $C_0$ during the bit of the PWM signal being at a high level, wherein the charge-discharge node C of the charge-discharge capacitor $C_0$ is at a voltage $V_C$ when the charging and discharging for the bit of the PWM signal is completed; and S3: determining a polarity of a voltage difference $_\Delta V$ between the voltage $V_C$ and the common mode voltage VCM to identify and thus decode the PWM signal.

\* \* \* \* \*